(12) United States Patent
Simons et al.

(10) Patent No.: US 10,249,929 B1
(45) Date of Patent: *Apr. 2, 2019

(54) MULTIMODE DIRECTIONAL COUPLER

(71) Applicant: The United States of America as represented by the Administrator of the National Aeronautics and Space Administration, Washington, DC (US)

(72) Inventors: Rainee N Simons, North Olmsted, OH (US); Edwin G Wintucky, Willoughby, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 49 days.

This patent is subject to a terminal disclaimer.

(21) Appl. No.: 15/010,195

(22) Filed: Jan. 29, 2016

(51) Int. Cl.
*H01P 1/10* (2006.01)
*H01P 5/12* (2006.01)
*H01P 5/18* (2006.01)

(52) U.S. Cl.
CPC ..................... *H01P 5/18* (2013.01)

(58) Field of Classification Search
CPC ............ H01P 5/18; H01P 5/181; H01P 5/182
USPC ......................................................... 333/113
See application file for complete search history.

(56) References Cited

U.S. PATENT DOCUMENTS

| | | | | |
|---|---|---|---|---|
| 2,632,809 A | * | 3/1953 | Riblet | H01P 5/182 333/113 |
| 2,748,350 A | * | 5/1956 | Miller | H01P 1/163 333/1 |
| 2,817,063 A | * | 12/1957 | Kurtz | H01P 5/182 333/113 |
| 2,820,202 A | * | 1/1958 | Miller | H01P 5/04 333/113 |
| 2,848,691 A | * | 8/1958 | Harkless | H01P 5/182 333/113 |
| 2,871,452 A | * | 1/1959 | Hewlett | H01P 5/182 333/113 |

(Continued)

FOREIGN PATENT DOCUMENTS

JP   53113454 A  * 10/1978  .............. H01P 5/182

OTHER PUBLICATIONS

Harrington, R.F., Time-Harmonic Electromagnetic Fields, McGraw-Hill Book Co., New York, 1961, p. 150, equation (4-24).

(Continued)

*Primary Examiner* — Dean Takaoka

(74) *Attorney, Agent, or Firm* — Robert H. Earp, II; William M. Johnson

(57) ABSTRACT

A multimode directional coupler is provided. In some embodiments, the multimode directional coupler is configured to receive a primary signal and a secondary signal at a first port of a primary waveguide. The primary signal is configured to propagate through the primary waveguide and be outputted at a second port of the primary waveguide. The multimode directional coupler also includes a secondary waveguide configured to couple the secondary signal from the primary waveguide with no coupling of the primary signal into the secondary waveguide. The secondary signal is configured to propagate through the secondary waveguide and be outputted from a port of the secondary waveguide.

19 Claims, 21 Drawing Sheets

(56) References Cited

U.S. PATENT DOCUMENTS

| | | | | |
|---|---|---|---|---|
| 2,948,864 | A | * | 8/1960 | Miller .................. H01P 5/16 333/113 |
| 3,230,482 | A | * | 1/1966 | Cohn .................. H01P 5/182 333/113 |
| 3,914,713 | A | * | 10/1975 | Konishi .................. H01P 1/00 333/1.1 |
| 3,916,352 | A | * | 10/1975 | Powell .................. H01P 1/209 333/208 |
| 3,938,056 | A | | 2/1976 | Pond |
| 3,976,953 | A | | 8/1976 | Garrigus et al. |
| 4,028,650 | A | * | 6/1977 | Konishi .................. H01P 1/00 333/210 |
| 4,414,686 | A | | 11/1983 | Lenz |
| 4,429,417 | A | | 1/1984 | Yool |
| 4,567,401 | A | * | 1/1986 | Barnett .................. H01J 23/24 315/3.6 |
| 4,792,770 | A | * | 12/1988 | Parekh .................. H01P 5/16 333/113 |
| 5,410,318 | A | * | 4/1995 | Wong .................. H01P 1/16 333/113 |
| 5,416,452 | A | * | 5/1995 | Noerpel .................. H01P 1/16 333/113 |
| 5,838,195 | A | | 11/1998 | Szmurlo et al. |
| 6,512,474 | B2 | | 1/2003 | Pergande |
| 7,777,672 | B2 | | 8/2010 | Schnitzer et al. |
| 7,863,988 | B2 | | 1/2011 | Baek et al. |
| 7,994,962 | B1 | | 8/2011 | Ben-Shmuel |
| 8,362,963 | B2 | | 1/2013 | Rakotoarisoa et al. |
| 9,252,477 | B1 | * | 2/2016 | Simons .................. H01P 5/18 |
| 2013/0002472 | A1 | | 1/2013 | Crouch |

OTHER PUBLICATIONS

Gilmour, Jr., A.S., Microwave Tubes, Artech House Inc., Norwood, MA, 1986, Section 10.6.2, pp. 275-277.

Pozer, D.M., Microwave Engineering, Third Edition, John Wiley & Sons, Inc., Hoboken, NJ, 2005, p. 114.

Southworth, G.C., Principles and Applications of Waveguide Transmission, D. Van Nostrand Co, Inc., Princeton, NJ, 1950, p. 118.

* cited by examiner

MULTIMODE DIRECTIONAL COUPLER

ORIGIN OF THE INVENTION

The invention described herein was made by employees of the United States Government and may be manufactured and used by or for the Government for Government purposes without the payment of any royalties thereon or therefore.

FIELD

The present invention relates to a multimode directional coupler and, more particularly, to a multimode directional coupler configured to extract $2^{nd}$ or higher harmonic signals from an amplifier.

BACKGROUND

When a higher frequency is desired for satellite communications, an atmosphere propagation study is generally required. For instance, a low power transmitter (e.g., a beacon source) is attached to the satellite. The low power transmitter normally does not transmit any data, but instead transmits a beacon (e.g., continuous waveform (CW) signal) to a receiving station on Earth. The receiving station studies include the CW signal fades, the signal propagation delay and the signal group velocity changes due to weather effects. This study is typically conducted over 3-5 years to obtain sufficient statistics. For instance, if the weather in a certain area has high rate of rain, then the statistics will show that the transmitter power may have to be increased. However, if the receiving station is located in a desert with little or no rain, the statistics may show that the transmitter power may not have to be increased.

However, with a conventional beacon source, as frequency is increased, it becomes a challenge to build a new beacon source for the transmitter on the satellite. This is because at higher frequencies, transistors do not function efficiently and tube manufacturing also becomes a challenge. Thus, a new beacon configuration or architecture may be beneficial.

SUMMARY

Certain embodiments of the present invention may provide solutions to the problems and needs in the art that have not yet been fully identified, appreciated, or solved by conventional beacon configurations. For instance, one or more embodiments of the present invention pertain to a multimode directional coupler configured to extract $2^{nd}$ or higher harmonic (e.g. $3^{rd}$, $4^{th}$, or $5^{th}$) signals from a traveling wave tube amplifier (TWTA) with minimum perturbation to a fundamental signal. In some embodiments, a solid-state power amplifier (SSPA) or a microwave power module (MPM) may be utilized instead of the TWTA.

In one embodiment, an apparatus is provided. The apparatus includes a primary waveguide configured to propagate a fundamental signal from one port to another. The apparatus also includes a secondary waveguide configured to extract $2^{nd}$ or higher harmonic signals from the primary waveguide without perturbing the fundamental signal.

In another embodiment, an apparatus is provided. The apparatus includes a primary waveguide configured to receive a primary signal and at least one secondary signal at a first port. The apparatus also includes a secondary waveguide configured to extract the at least one secondary signal from the primary waveguide such that the primary signal is prevented from coupling into the secondary waveguide.

In yet another embodiment, an apparatus is provided. The apparatus includes a primary waveguide configured to receive a dominant mode frequency and at least one higher order mode frequency. The apparatus also includes a secondary waveguide coupled to the primary waveguide that is configured to extract the at least one higher order mode frequency from the primary waveguide with minimum perturbation of the dominant mode frequency.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
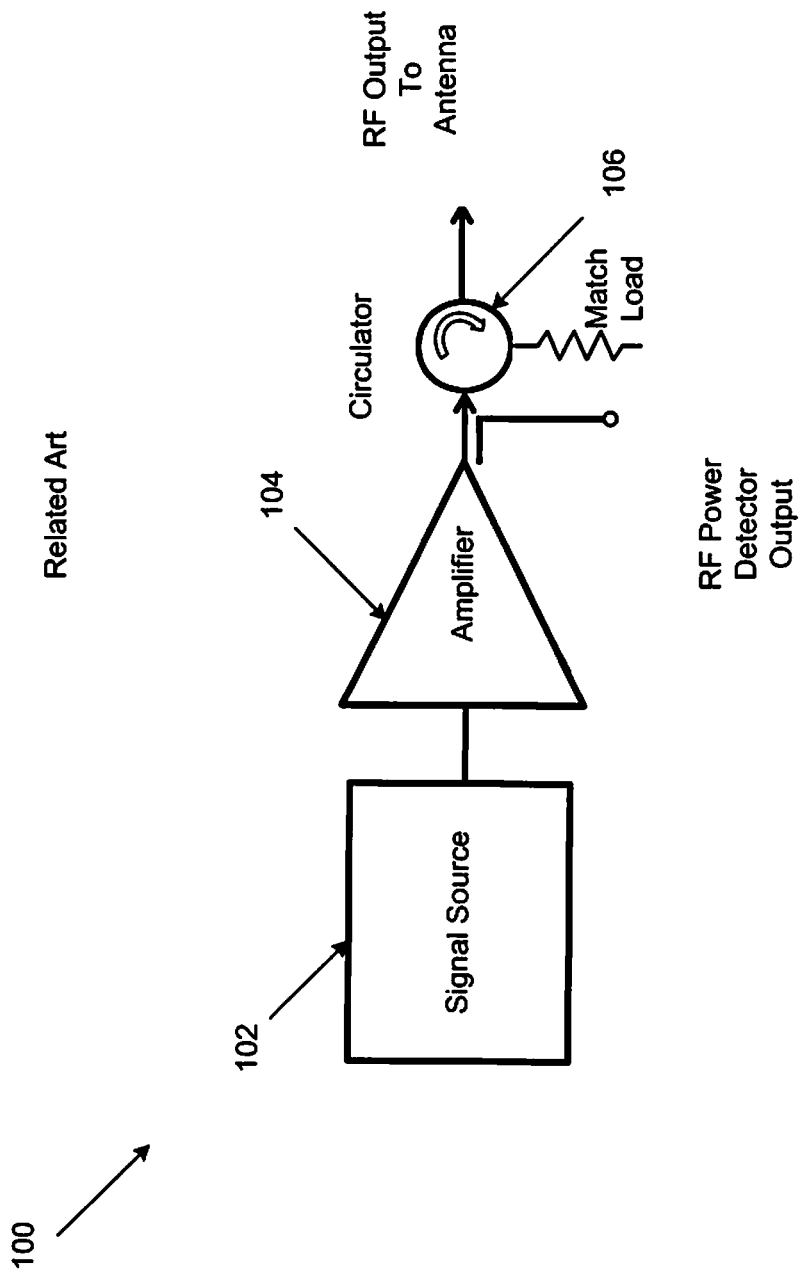
FIG. 1 is a schematic illustrating a conventional beacon configuration.

FIG. 1 is a schematic 100 illustrating a conventional beacon configuration. The conventional beacon configuration may include a Q-band or V-band signal source 102 configured to generate a signal. Because the frequency spectrum is divided into bands, signals operating in 26.5 to 40 Gigahertz (GHz) are known as Ka-band signals, signals operating in 33-50 GHz are known as Q-band signals, signals operating in 50-75 GHz are known as V-band signals, signals operating in 60-90 GHz are known as E-band signals, and signals operating in the 75-110 GHz are known as W-band signals. An amplifier 104 amplifies or excites the signal, and a circulator 106 transmits the amplified signal (e.g., radio frequency (RF) output) to an antenna, such that the amplified signal can be transmitted to a receiving station on Earth. Circulator 106 also couples any reflections from the antenna to a match load. Also, a RF power detector monitors the amount of power that the beacon outputs from amplifier 104.

With the conventional beacon configuration, as frequency is increased, it becomes a challenge to develop a new beacon source for the transmitter on the satellite. Because at higher frequencies, transistors do not function efficiently and tube manufacturing also becomes a challenge. Instead of building a new beacon source each time a higher frequency is desired, a beacon configuration using $2^{nd}$ or higher harmonic from a traveling wave tube amplifier (TWTA) 202 may be beneficial. For instance, a multimode coupler in some embodiments may be used to couple the $2^{nd}$ or higher harmonic power, which can be amplified, and transmitted down to a receiving station on Earth.

Figure 2:
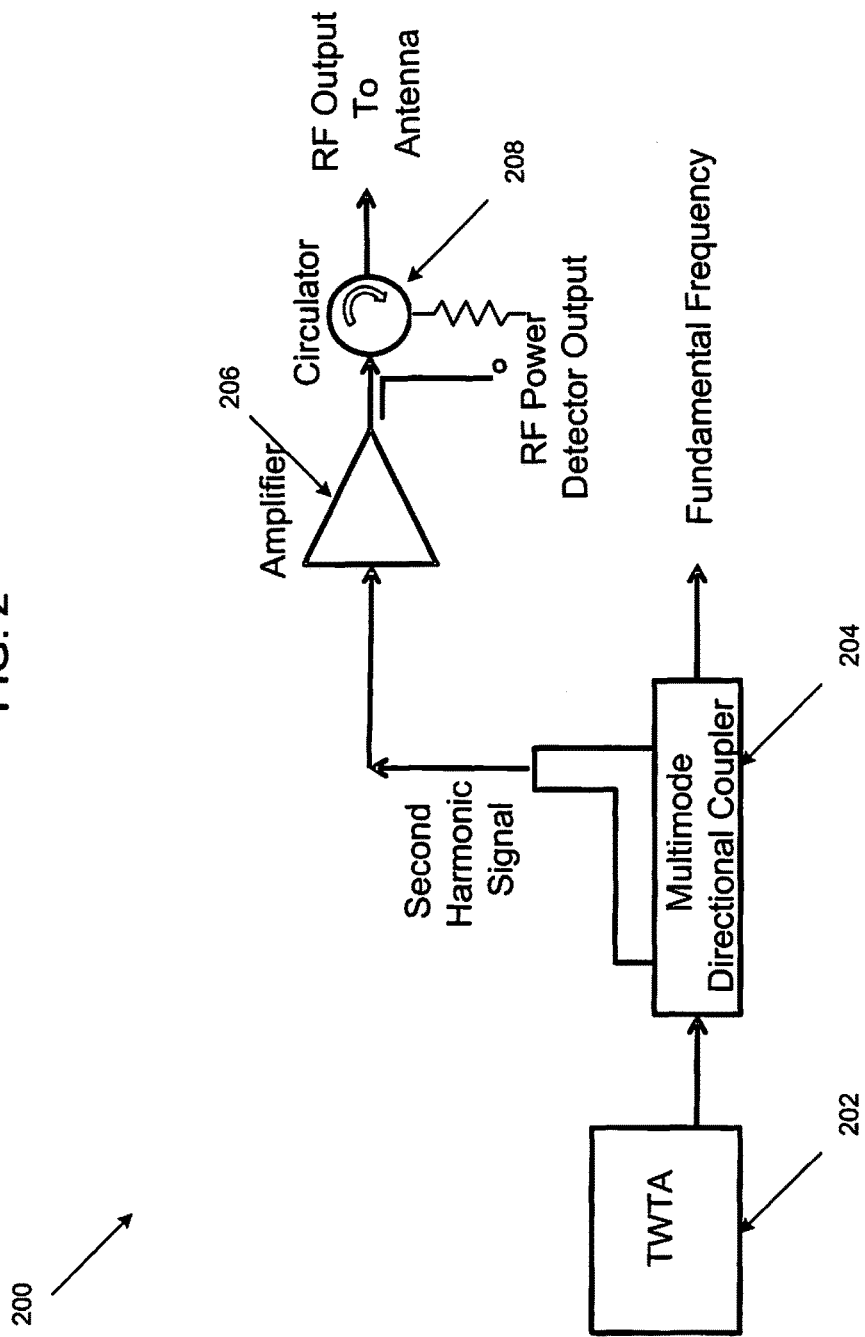
FIG. 2 is a schematic illustrating a beacon configuration using a $2^{nd}$ harmonic from a traveling wave tube amplifier (TWTA), according to an embodiment of the present invention.

FIG. 2 is a schematic 200 illustrating a beacon configuration using a $2^{nd}$ harmonic from a TWTA, according to an embodiment of the present invention. In this embodiment, TWTA 202 receives a signal from a signal source (not shown). In other embodiments, a solid-state power amplifier (SSPA) or a microwave power module (MPM) may be utilized instead of the TWTA. The signal source may be a Ku-band signal source, a Ka-band signal source, or a signal source in any band that would be appreciated by a person of ordinary skill in the art.

TWTA 202 may amplify the received signal and transmit the amplified signal to a multimode directional coupler 204. Multimode directional coupler 204 may select (or separate) the $2^{nd}$ or higher harmonic power signal from the fundamental frequency (or signal), and transmit the $2^{nd}$ or higher harmonic power signal to amplifier 206 to be amplified. The amplified $2^{nd}$ harmonic power signal may pass through a circulator 208 to an antenna on a satellite to be transmitted to a receiving station on Earth.

In one example, if the signal source output is a Ku-band signal at 14 GHz, the $2^{nd}$ harmonic power of the Ku-band signal is at 28 GHz. Multimode direction coupler 204 in this example would select the $2^{nd}$ harmonic power signal of the Ku-band signal, such that $2^{nd}$ harmonic power signal of the Ku-band signal is amplified and circulated prior to transmission to the receiving station. It should also be appreciated that depending on the design of multimode directional coupler 204, the $2^{nd}$ or higher harmonic power signal of a Ka-band signal, a Q-band signal, a V-band signal, a E-band signal, or a W-band signal may be separated.

It should be appreciated that the fundamental frequency signal carrying the science data from an assortment of instruments onboard the satellite or spacecraft may be transmitted to its appropriate destination by separate antennas.

Figure 3:
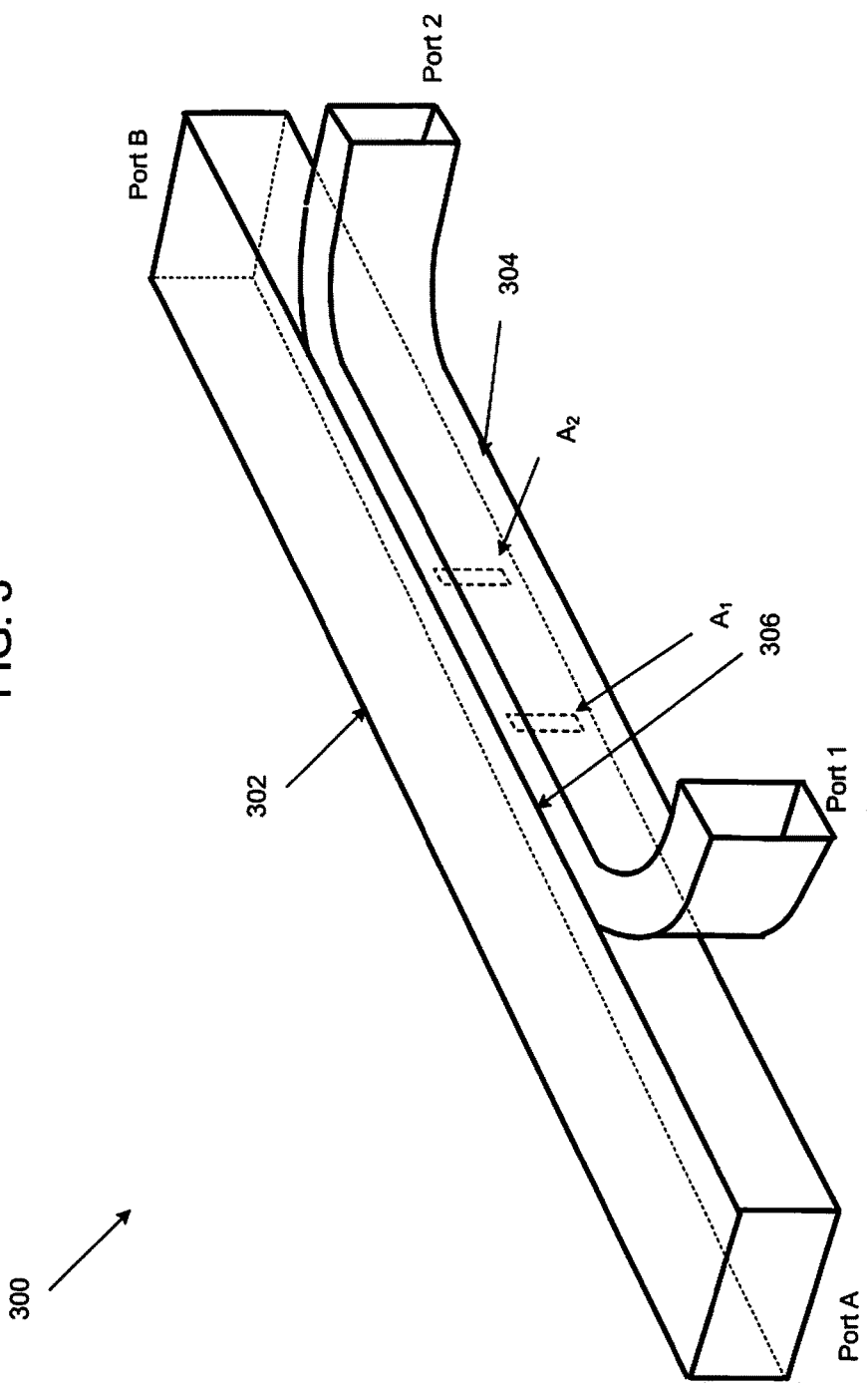
FIG. 3 is a schematic illustrating a multimode directional coupler, according to an embodiment of the present invention.

FIG. 3 is a schematic 300 illustrating a multimode directional coupler, according to an embodiment of the present invention. In this embodiment, a primary waveguide 302 having Ports A and B is connected to a secondary waveguide 304 having Ports 1 and 2. The fundamental frequency (or signal), which is the output of TWTA 202 shown in FIG. 2, travels through primary waveguide 302, and the $2^{nd}$ or higher harmonic frequency (or signal), which may be separated from the fundamental signal, travels through secondary waveguide 304. Some embodiments may include more than one higher order mode frequency.

It should be appreciated that the dimensions of primary waveguide 302 and secondary waveguide 304 are different. For example, if a Ka-band signal is operating at 30-35 GHz, the $2^{nd}$ harmonic power of the Ka-band signal may operate at 60-70 GHz. This may cause the $2^{nd}$ harmonic power to operate in V-band. To accommodate these frequencies, the dimensions of secondary waveguide 304 are different from those of primary waveguide 302. In other words, the dimensions of primary waveguide 302 and secondary waveguide 304 vary according to the frequency of the fundamental and the $2^{nd}$ or higher harmonic signals.

It should be noted that in this embodiment primary waveguide 302 and secondary waveguide 304 share a common wall 306. Wall 306 may include apertures $A_1$, $A_2$. Apertures $A_1$, $A_2$ may have a rectangular opening, a rectangular opening with rounded corners, a circular opening, or any type of arbitrary shaped opening that would be appreciated by a person of ordinary skill in the art. Depending on the desired band, the height, width and shape of each aperture $A_1$, $A_2$ and the distance between each aperture $A_1$, $A_2$ may vary. Furthermore, the number of apertures may also vary depending on the desired coupling and bandwidth. See, for example, FIG. 5, which shows more than two apertures.

Generally, when a waveguide is designed, the waveguide is configured to carry the signal power in the fundamental mode only. For example, primary waveguide 302 may propagate the fundamental signal, e.g., dominant transverse electric ($TE_{10}$) mode, from Port A to Port B. However, when a $2^{nd}$ or higher harmonic signal is in primary waveguide 302, the $2^{nd}$ or higher harmonic signal will propagate as a higher order (transverse magnetic ($TM_{mn}$) and transverse electric $TE_{mn}$) modes. For example, in order to sample the $2^{nd}$ harmonic signal, apertures $A_1$, $A_2$ are configured to couple to the higher order modes, i.e., the $TM_{11}$ and $TE_{11}$ modes. This allows the $2^{nd}$ harmonic signal to propagate through secondary waveguide 304. In other words, apertures $A_1$, $A_2$ are configured to prevent the fundamental signal in primary waveguide 302 from coupling into secondary waveguide 304, while allowing the $2^{nd}$ harmonic signal to enter into, and propagate through, secondary waveguide 304.

Figure 4:
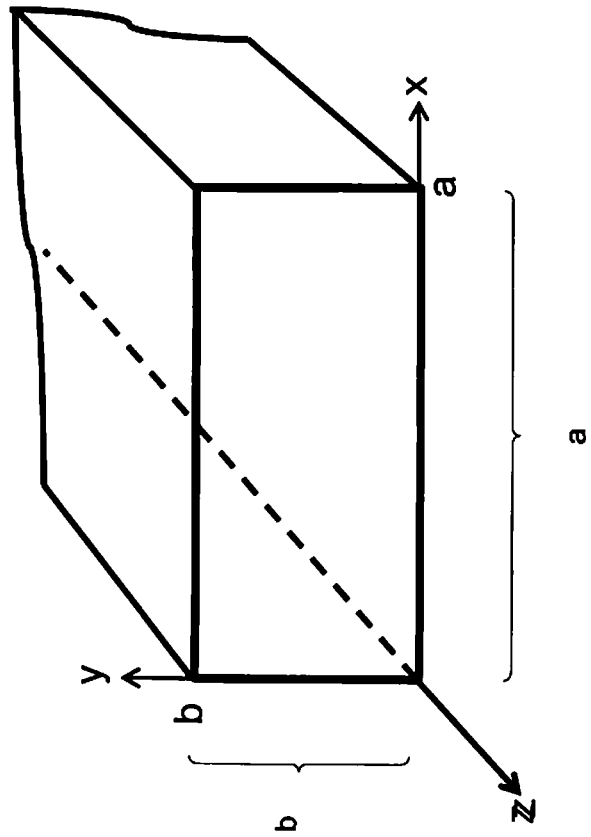
FIG. 4 illustrates a cross-sectional segment of a rectangular guide, according to an embodiment of the present invention.

FIG. 4 is a cross-sectional segment 400 illustrating a rectangular waveguide, according to an embodiment of the present invention. In particular, FIG. 4 shows a coordinate system of a rectangular waveguide. In this embodiment, for a primary waveguide, as shown in FIG. 3, the x-axis is the horizontal axis and the y-axis is the vertical axis. The waveguide may have a width 'a' and a height 'b'. The z-direction is the direction in which the signal propagates.

However, for a secondary waveguide, as shown in FIG. 3, the x-axis is now the vertical axis, and the y-axis is now the horizontal axis. The z-direction remains the direction in which the $2^{nd}$ harmonic signal propagates. Stated differently, the secondary waveguide may be rotated 90 degrees to the primary waveguide. This allows the $2^{nd}$ harmonic signal to propagate through the apertures into the secondary waveguide. It should be appreciated that in some embodiments the cross-section of the secondary waveguide is smaller than that of the primary waveguide. For example, the primary waveguide could be WR-62 for a fundamental signal at Ku-band and the secondary waveguide could be WR-28 for a $2^{nd}$ harmonic signal at Ka-band.

Figure 5:
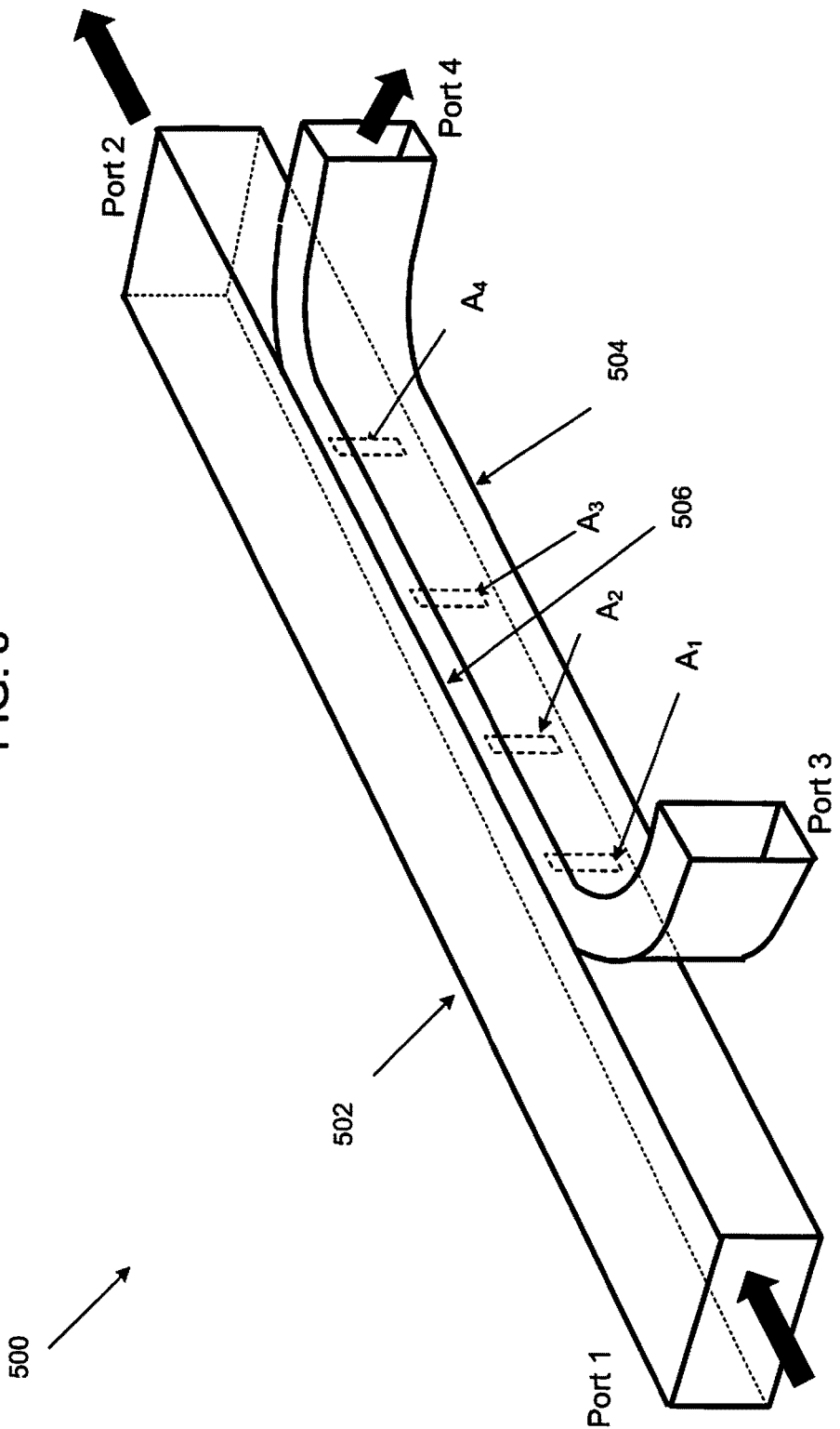
FIG. 5 is a schematic illustrating a lower millimeter-wave multimode directional coupler, according to an embodiment of the present invention.

FIG. 5 is a schematic 500 illustrating a lower millimeter-wave multimode directional coupler, according to an embodiment of the present invention. In this embodiment, a primary waveguide 502 is operably connected to a secondary waveguide 504 using a common wall 506. Wall 506 includes four apertures $A_1$, $A_2$, $A_3$, and $A_4$.

In this embodiment, the fundamental signal, including the $2^{nd}$ harmonic signal, enters primary waveguide 502 through Port 1. The fundamental signal propagates through primary waveguide 502, and exits from Port 2 of primary waveguide 502 with minimum perturbation. Apertures $A_1$, $A_2$, $A_3$, $A_4$ are configured to separate the $2^{nd}$ harmonic signal from the fundamental signal. For example, each aperture $A_1$, $A_2$, $A_3$, $A_4$ is configured to allow the $2^{nd}$ harmonic signal to couple into secondary waveguide 504. As portions of the $2^{nd}$ harmonic signal couple into secondary waveguide 504 through the apertures, each of the coupled portions of the $2^{nd}$ harmonic signal reinforce each other to form the output $2^{nd}$ harmonic signal. It should be appreciated that the $2^{nd}$ harmonic signal becomes the dominant frequency in secondary waveguide 304. The reinforced $2^{nd}$ harmonic signal may then propagate through secondary waveguide 504 and exit from Port 4, such that the $2^{nd}$ harmonic signal can be used as a beacon source. This beacon source signal may then be transmitted to a receiving station for radio wave propagation study through the Earth's atmosphere.

It should be noted that when the $2^{nd}$ harmonic signal is coupled out of primary waveguide 502, 100 percent of the $2^{nd}$ harmonic signal is not realized in secondary waveguide 504. In order to increase the coupling efficiency, a greater number of apertures may be used. By using more apertures, a greater number of coupling of portions of the $2^{nd}$ harmonic signal occur. This allows for a stronger (i.e., more reinforced) $2^{nd}$ harmonic signal to be produced, requiring a lesser amount of amplification of the $2^{nd}$ harmonic signal. However, it should be noted that the optimum number of apertures depends on the size of the multimode directional coupler. Further, as discussed above, the height and width of, and the distance between, each aperture may vary depending on the desired bandwidth and coupling.

Figure 6:
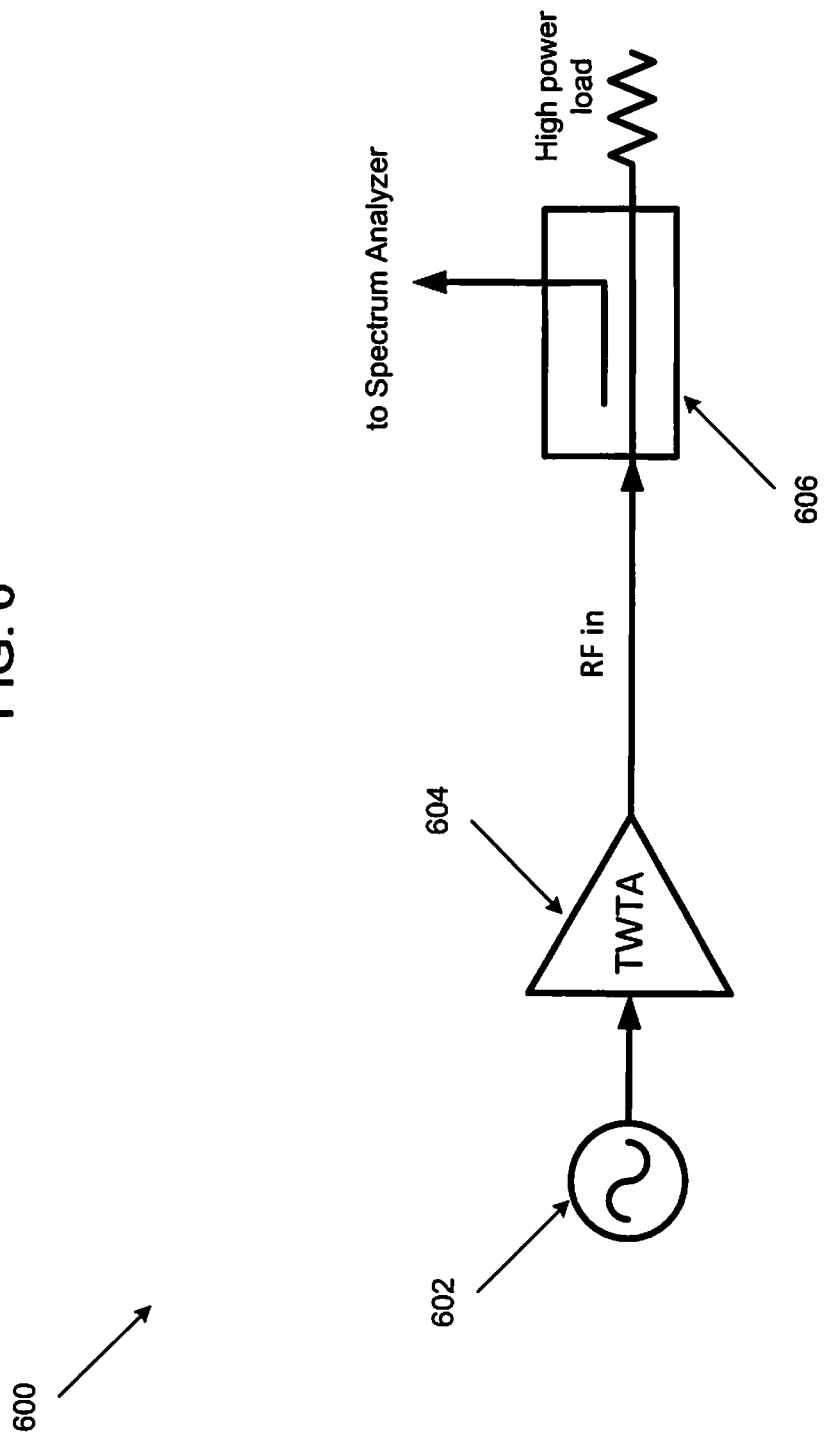
FIG. 6 is a schematic illustrating a test circuit for measurement of TWTA output power of fundamental and $2^{nd}$ harmonic frequencies, according to an embodiment of the present invention.

FIG. 6 is a schematic 600 illustrating a test circuit for measurement of TWTA output power of fundamental and $2^{nd}$ harmonic frequencies, according to an embodiment of the present invention. The test circuit of FIG. 6 is used to measure the output power levels of the fundamental signal and $2^{nd}$ harmonic signal from TWTA 604. In this embodiment, signal source 602 generates a fundament frequency signal (or frequency signal) and a TWTA 604 amplifies the frequency signal.

The amplified frequency signal travels to a broadband coaxial directional coupler 606. A small sample of the amplified frequency signal is coupled by the broadband coaxial directional coupler 606, and is transferred to a spectrum analyzer (not shown) so the power levels of the fundamental signal and the $2^{nd}$ harmonic signals can be analyzed. Broadband coaxial directional coupler 606, in certain embodiments, couples a portion of both the fundamental and the $2^{nd}$ harmonic signals.

In this example, the spectrum analyzer can measure and compare the TWTA output power at the fundamental and $2^{nd}$ harmonic signal frequencies. See, for example, FIGS. 7 and 8.

Figure 7:
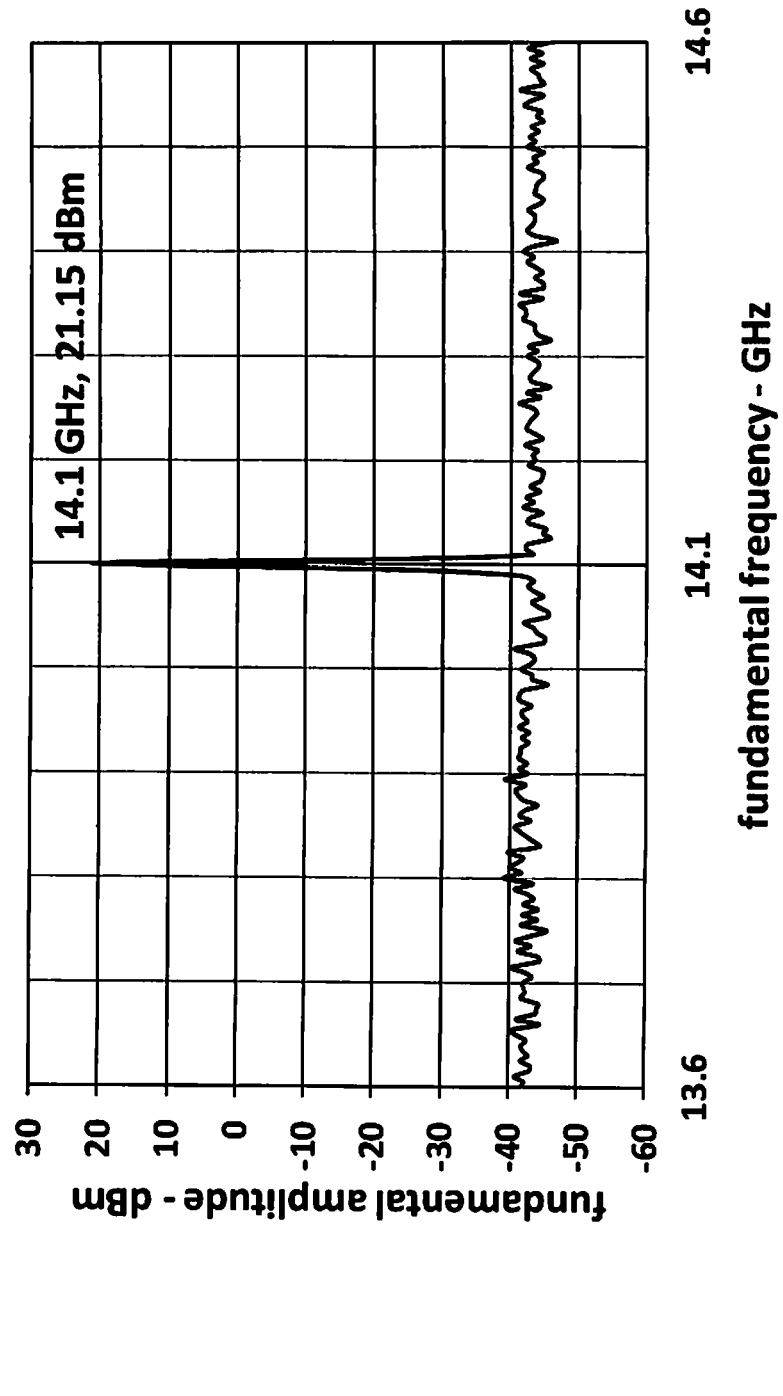
FIG. 7 is a graph illustrating a power level of a fundamental signal at TWTA saturation measured at TWTA output using a 13 dB broadband coaxial directional coupler, according to an embodiment of the present invention.
Figure 8:
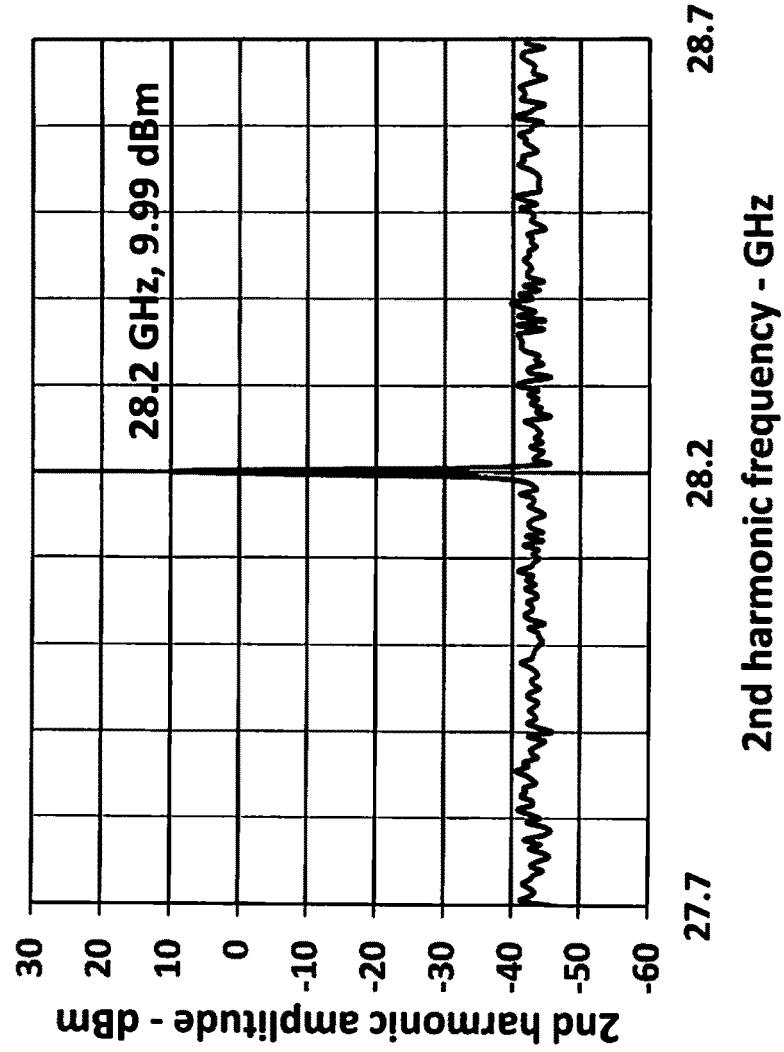
FIG. 8 is a graph illustrating a power level of a $2^{nd}$ harmonic signal at TWTA saturation measured at TWTA output using a 13 dB broadband coaxial directional coupler, according to an embodiment of the present invention.

In FIG. 7, graph 700 shows that the power level for the fundamental signal at 14.1 GHz as 21.15 dBm. In FIG. 8, graph 800 shows that the power level for the $2^{nd}$ harmonic signal at 28.2 GHz as 9.99 dBm. FIG. 8 further indicates that the signal strength at 28.2 GHz is strong, as it is 9.99 dBm. In other words, graphs of FIGS. 7 and 8 show the presence of both the fundamental signal as well as a strong $2^{nd}$ harmonic signal at TWTA radio frequency output.

Figure 9:
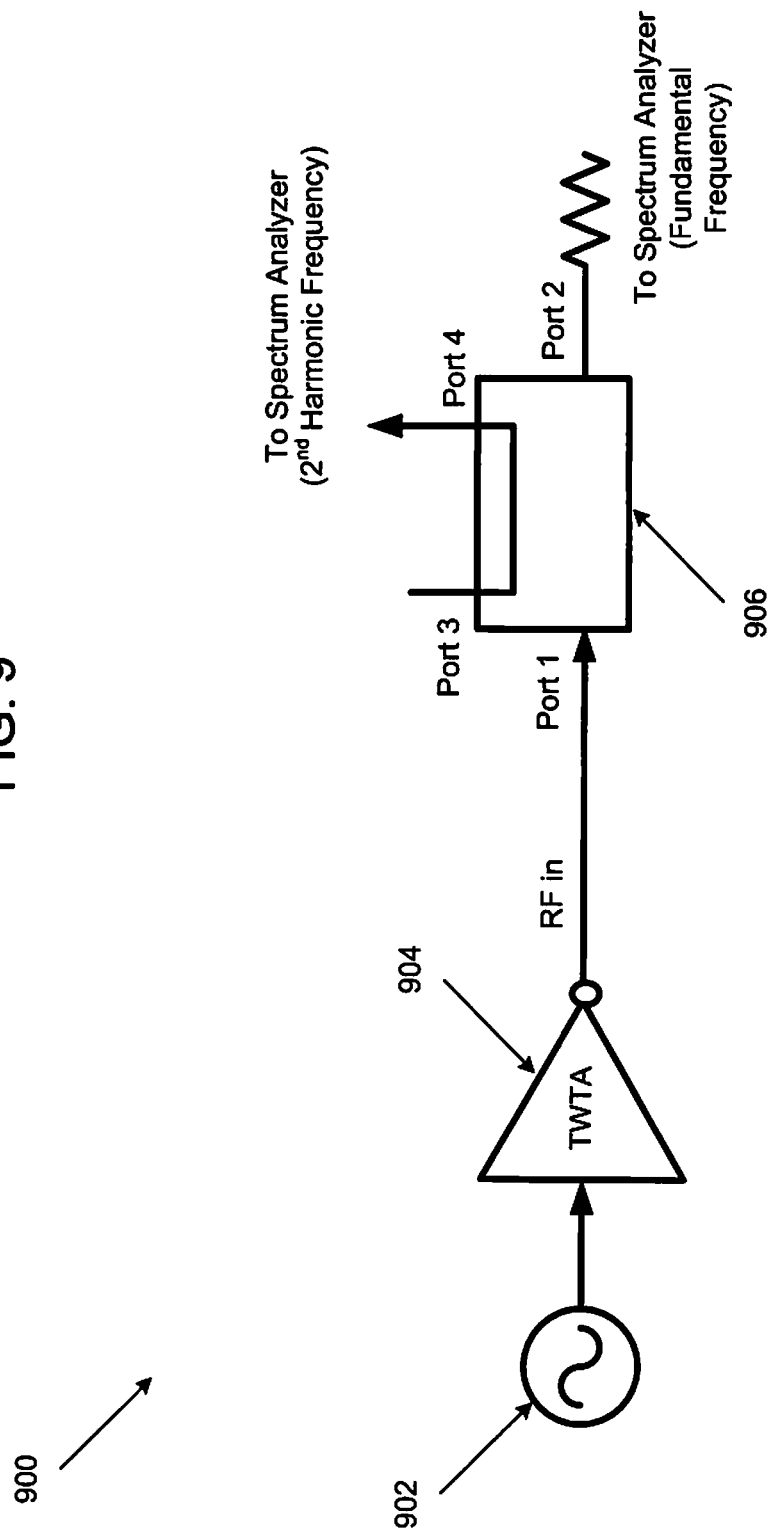
FIG. 9 is a schematic illustrating a test circuit for measurement of fundamental and $2^{nd}$ harmonic frequencies at TWTA saturation, according to an embodiment of the present invention.

FIG. 9 is a schematic 900 illustrating a test circuit for measurement of fundamental and $2^{nd}$ harmonic frequencies at TWTA saturation, according to an embodiment of the present invention. In particular, the test circuit of FIG. 9 is used to establish that multimode directional coupler 500 of FIG. 5 efficiently couples the $2^{nd}$ harmonic signal to secondary waveguide 504 and also prevents the fundamental signal from coupling into secondary waveguide 504.

In this embodiment, a signal source 902 generates a 14.1 GHz fundamental frequency, and a TWTA 904 amplifies the fundamental frequency. The amplified fundamental frequency may then enter multimode directional coupler 906. Multimode directional coupler 906 may be similar to multimode directional coupler 500 of FIG. 5. A spectrum analyzer (not shown) is connected to Port 2 and Port 4 of multimode directional coupler 906. This allows the spectrum analyzer to measure and compare the power levels of the fundamental signal from Port 2 with the $2^{nd}$ harmonic signal output from Port 4. In addition, this configuration also allows validating that the fundamental signal does not couple to the secondary waveguide. See, for example, FIGS. 10 and 11.

Figure 10:
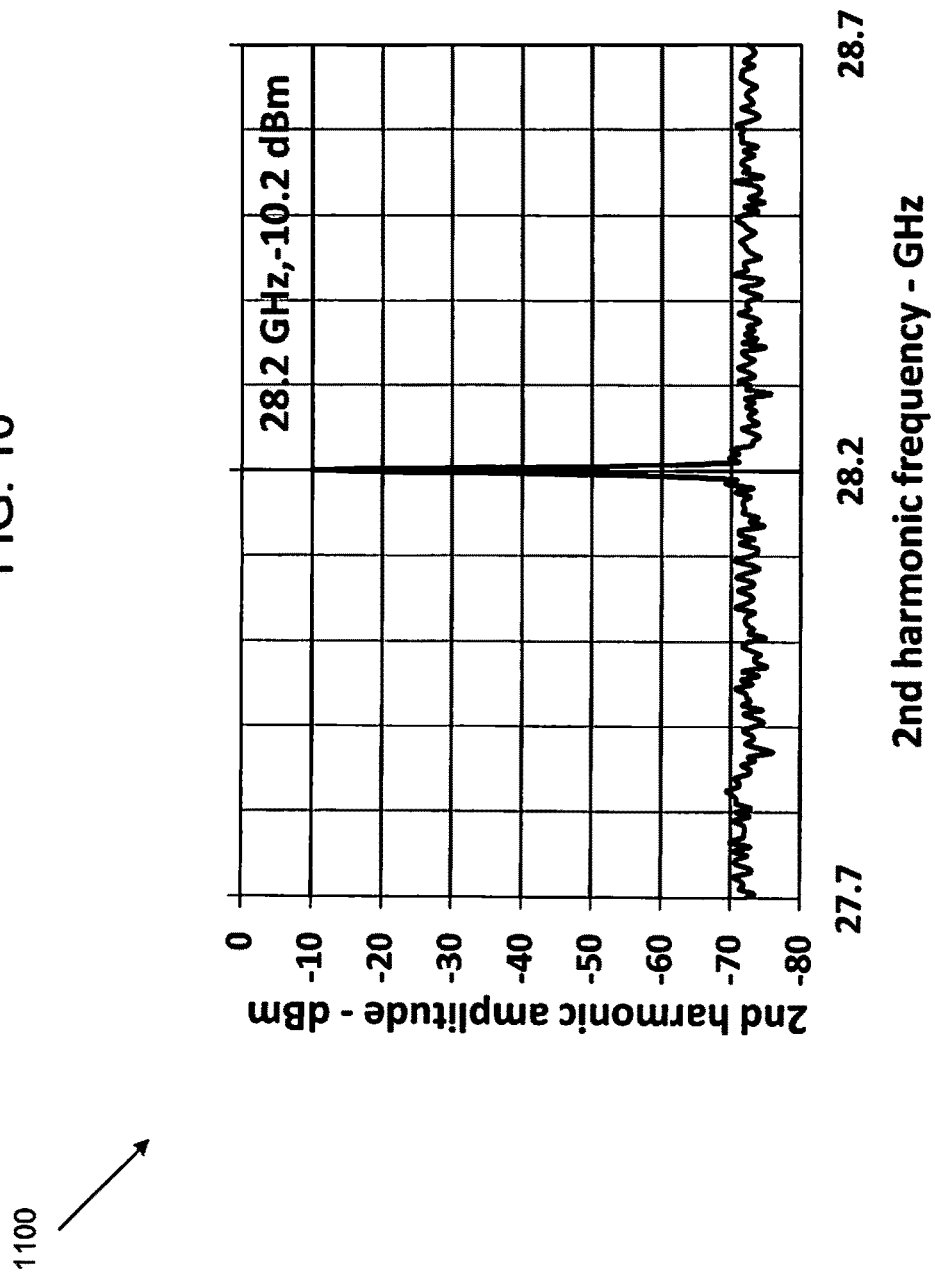
FIG. 10 is a graph illustrating a power level of a $2^{nd}$ harmonic measured at the output of Port 4 of a multimode directional coupler, according to an embodiment of the present invention.
Figure 11:
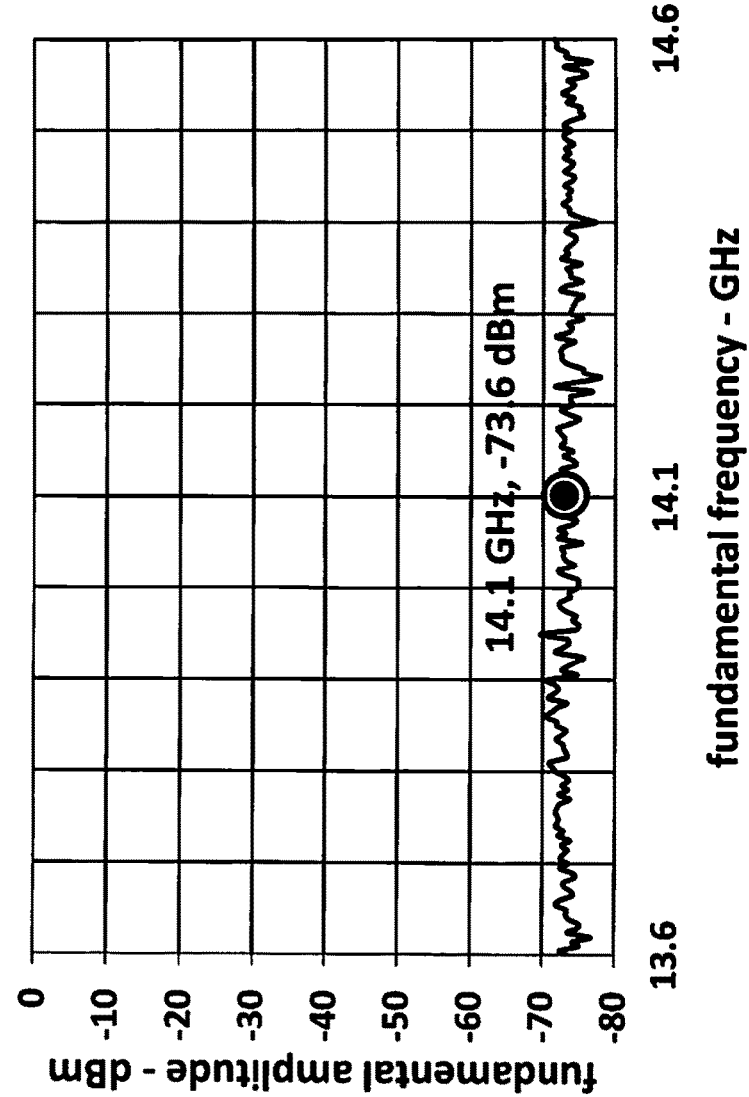
FIG. 11 is a graph illustrating a power level of a fundamental signal measured at the output of Port 4 of a multimode directional coupler, according to an embodiment of the present invention.

FIG. 10 is a graph 1000 illustrating a power level of a $2^{nd}$ harmonic measured at the output of Port 4 of a multimode directional coupler, according to an embodiment of the present invention. FIG. 11 is a graph 1100 illustrating a power level of a fundamental signal measured at the output of Port 4 of a multimode directional coupler, according to an embodiment of the present invention. In particular, graph 1100 of FIG. 11 shows that the fundamental signal does not couple into the secondary waveguide of the multimode directional coupler, as the signal strength of the fundamental signal measured at Port 4 is at −73.6 dBm or smaller.

Figure 12:
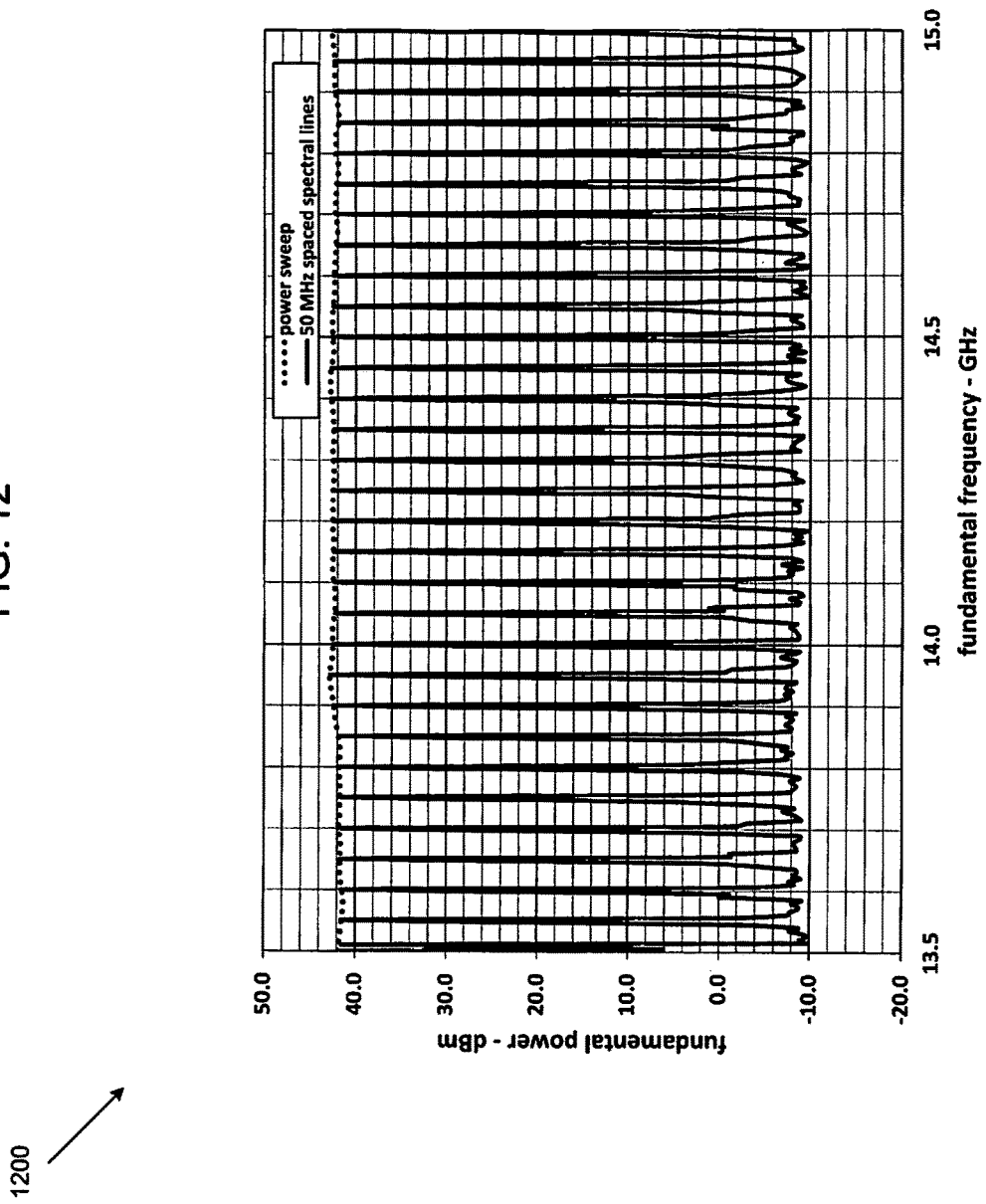
FIG. 12 is a graph illustrating the measured radio frequency power at Port 2 of the multimode directional coupler at Ku-band fundamental frequencies, 13.5 to 15.0 GHz, according to an embodiment of the present invention.
Figure 13:
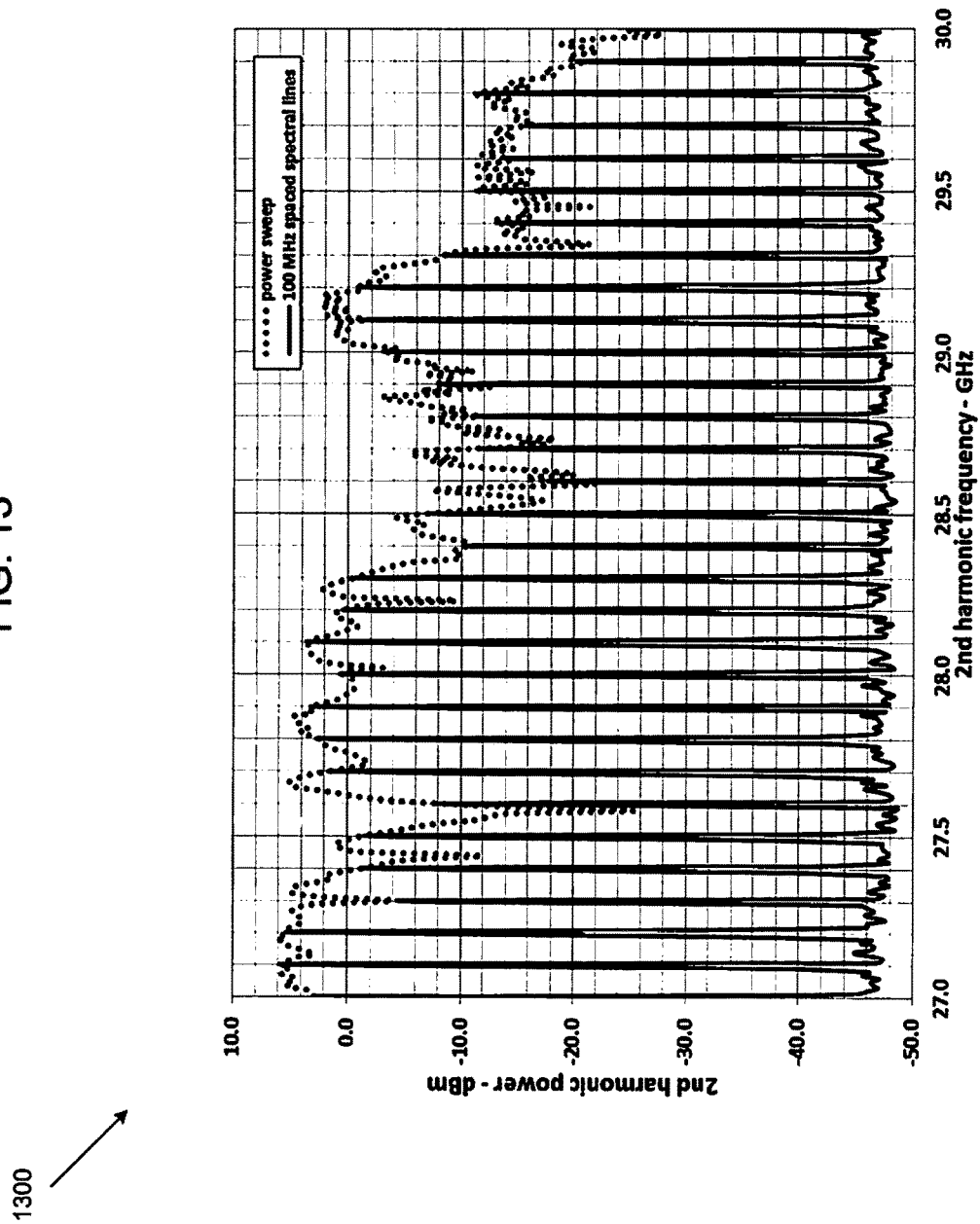
FIG. 13 is a graph illustrating the measured radio frequency power at Port 4 of the multimode directional coupler at Ka-band $2^{nd}$ harmonic frequencies, 27.0 to 30.0 GHz, according to an embodiment of the present invention.

Using the test circuit shown in FIG. 9, FIG. 12 shows a graph 1200 illustrating the measured radio frequency power at Port 2 of the multimode directional coupler at several Ku-band fundamental frequencies in the 13.5 to 15.0 GHz range. FIG. 13 also shows a graph 1300 illustrating the measured radio frequency power at Port 4 of the multimode directional coupler at the corresponding Ka-band $2^{nd}$ harmonic frequencies in the 27 to 30 GHz range. The measured data shows the presence of a strong $2^{nd}$ harmonic signal over a wide range of frequencies, which could be used as a beacon source for radio wave propagation studies.

Figure 14:
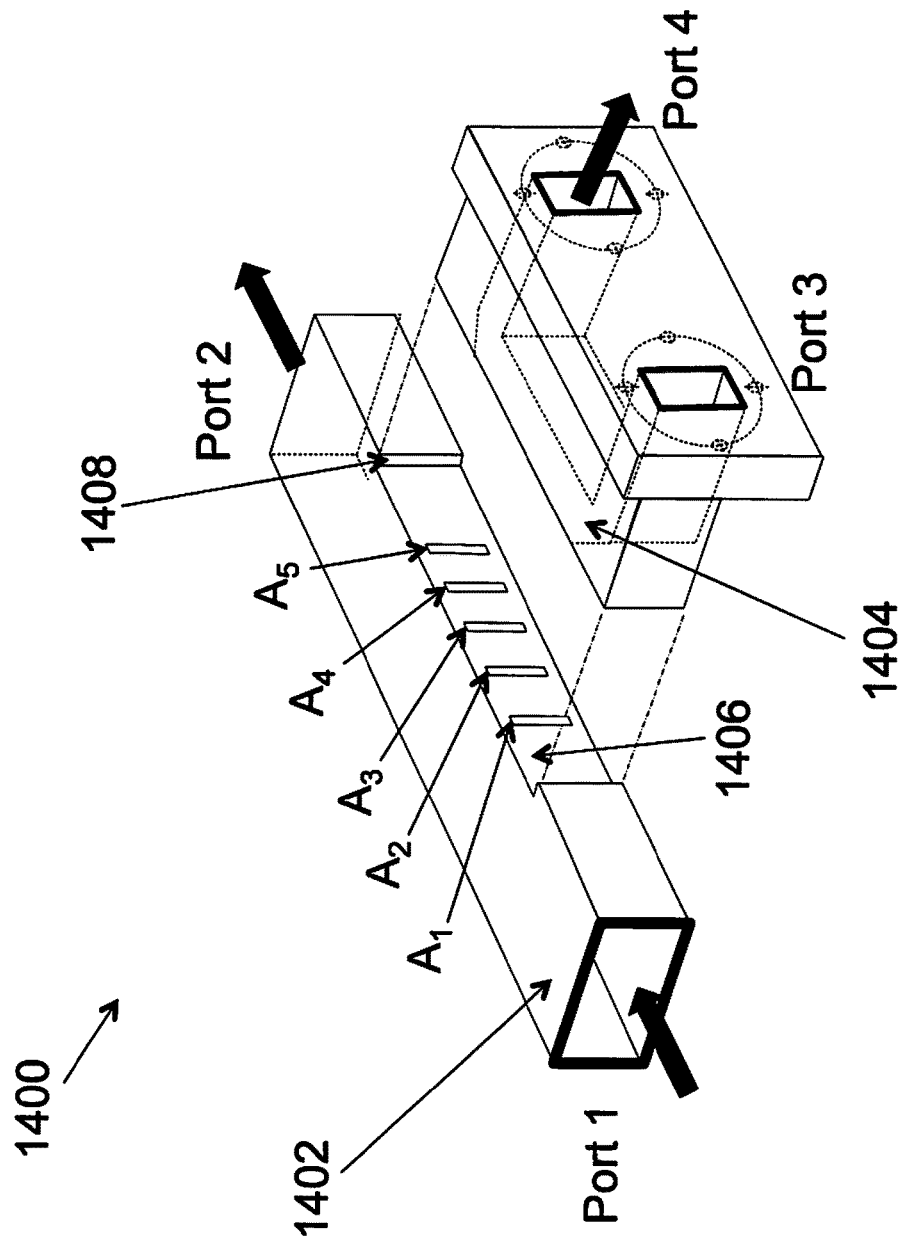
FIG. 14 is a schematic illustrating a higher millimeter-wave multimode directional coupler, according to an embodiment of the present invention.

FIG. 14 is a schematic 1400 illustrating a higher millimeter-wave multimode directional coupler, according to an embodiment of the present invention. In this embodiment, a primary waveguide 1402 having a first longitudinal axis and Ports 1 and 2 is operably connected to a secondary waveguide 1404 having a second longitudinal axis and Ports 3 and 4 using a common wall 1406. The secondary waveguide is rotated by 90 degrees about the second longitudinal axis.

For precision manufacturing and for efficient operation at higher millimeter-wave frequencies, the common wall 1406 thickness is reduced. Milling makes the reduction 1408. As an example, the common wall 1406 includes five apertures $A_1$, $A_2$, $A_3$, $A_4$, and $A_5$, which are precision machined using a laser. Alternatively, and with respect to FIG. 21, a primary waveguide 2002 and a secondary waveguide 2004 may be produced without the wall portion commonly shared during construction. In an alternate construction, the common wall 2006 with the apertures $A_1$, $A_2$, $A_3$, etc., may be fabricated from a thin foil, possibly metal, and sandwiched between the primary and secondary waveguides during construction. Such a construction allows the dimensions of the common wall and the material properties and dimensions of the common wall and apertures to be controlled for production.

It should be appreciated that the dimensions of the primary waveguide 1402 and the secondary waveguide 1404 are different. For example, the primary waveguide could be WR-28 for a fundamental signal at Ka-band and the secondary waveguide could be WR-12 for a $2^{nd}$ harmonic signal at E-band. By having different dimensions, the secondary waveguide is below cut-off at the fundamental frequency, which further prevented the fundamental signal from coupling to the secondary waveguide.

In this embodiment, the fundamental signal, including the $2^{nd}$ harmonic signal, enters primary waveguide 1402 through Port 1. The fundamental signal propagates through primary waveguide 1402, and exits from Port 2 of primary waveguide 1402 with minimum perturbation. Apertures $A_1$, $A_2$, $A_3$, $A_4$, and $A_5$ are configured to separate the $2^{nd}$ harmonic signal from the fundamental signal. For example, if the Ka-band fundamental signal is operating at 31 to 38 GHz, the $2^{nd}$ harmonic power of the Ka-band signal may operate at E-band 62 to 76 GHz. Each aperture $A_1$, $A_2$, $A_3$, $A_4$, and $A_5$ is configured to allow the $2^{nd}$ harmonic signal to couple into secondary waveguide 1404. As portions of the $2^{nd}$ harmonic signal couple into secondary waveguide 1404 through the apertures, each of the coupled portions of the $2^{nd}$ harmonic signal reinforce each other to form the output $2^{nd}$ harmonic signal. It should be appreciated that the $2^{nd}$ harmonic signal becomes the dominant frequency in secondary waveguide 1404. The reinforced $2^{nd}$ harmonic signal may then propagate through secondary waveguide 1404 and exit from Port 4, such that the $2^{nd}$ harmonic signal can be used as a E-band beacon source. This beacon source signal may then be transmitted from a satellite to a ground receiving station for radio wave propagation study through the Earth's atmosphere.

Figure 15:
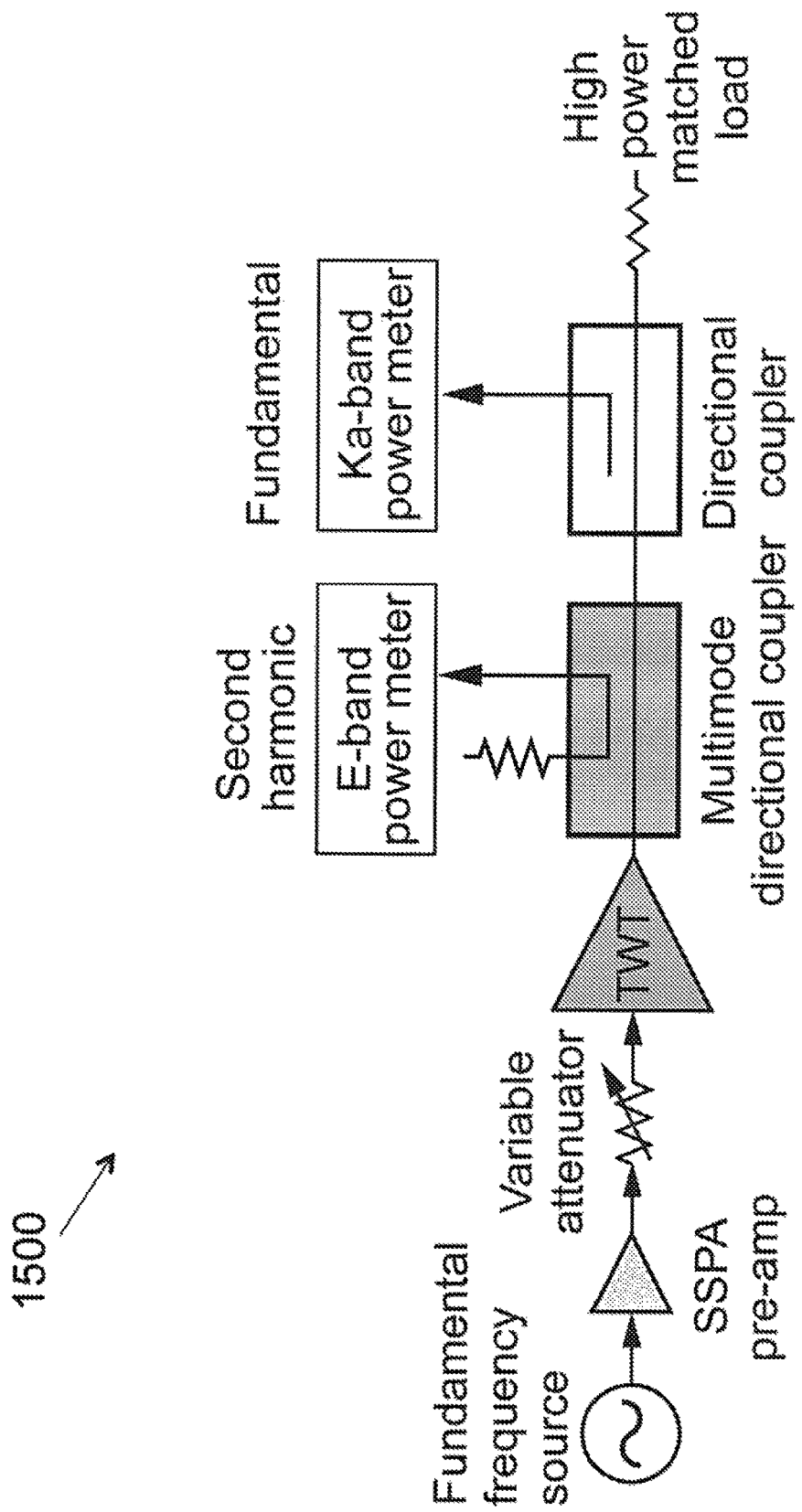
FIG. 15 is a schematic illustrating a test circuit with power meters for measurement of the fundamental and $2^{nd}$ harmonic signal power levels from a frequency source, according to an embodiment of the present invention.

FIG. 15 is a schematic 1500 illustrating a test circuit using power meters for measurement of power at the fundamental and $2^{nd}$ harmonic frequencies from a frequency source, according to an embodiment of the present invention. In particular, the test circuit of FIG. 15 is used to establish that multimode directional coupler 1400 of FIG. 14 efficiently couples the $2^{nd}$ harmonic signal to secondary waveguide 1404.

Figure 16:
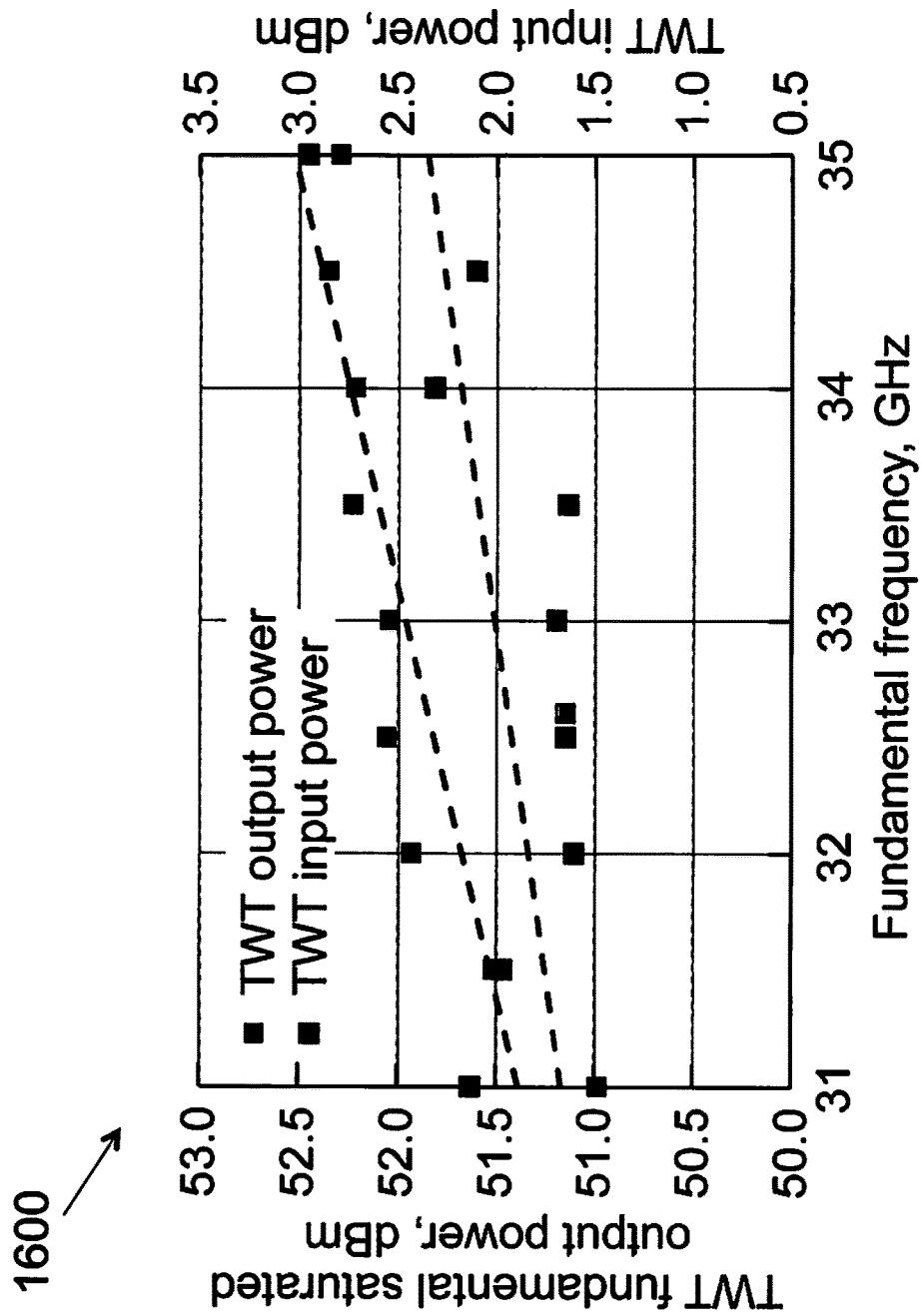
FIG. 16 is a graph illustrating the measured radio frequency power at Port 2 of the higher millimeter-wave multimode directional coupler at Ka-band fundamental frequencies, 31.0 to 35.0 GHz, according to an embodiment of the present invention.
Figure 17:
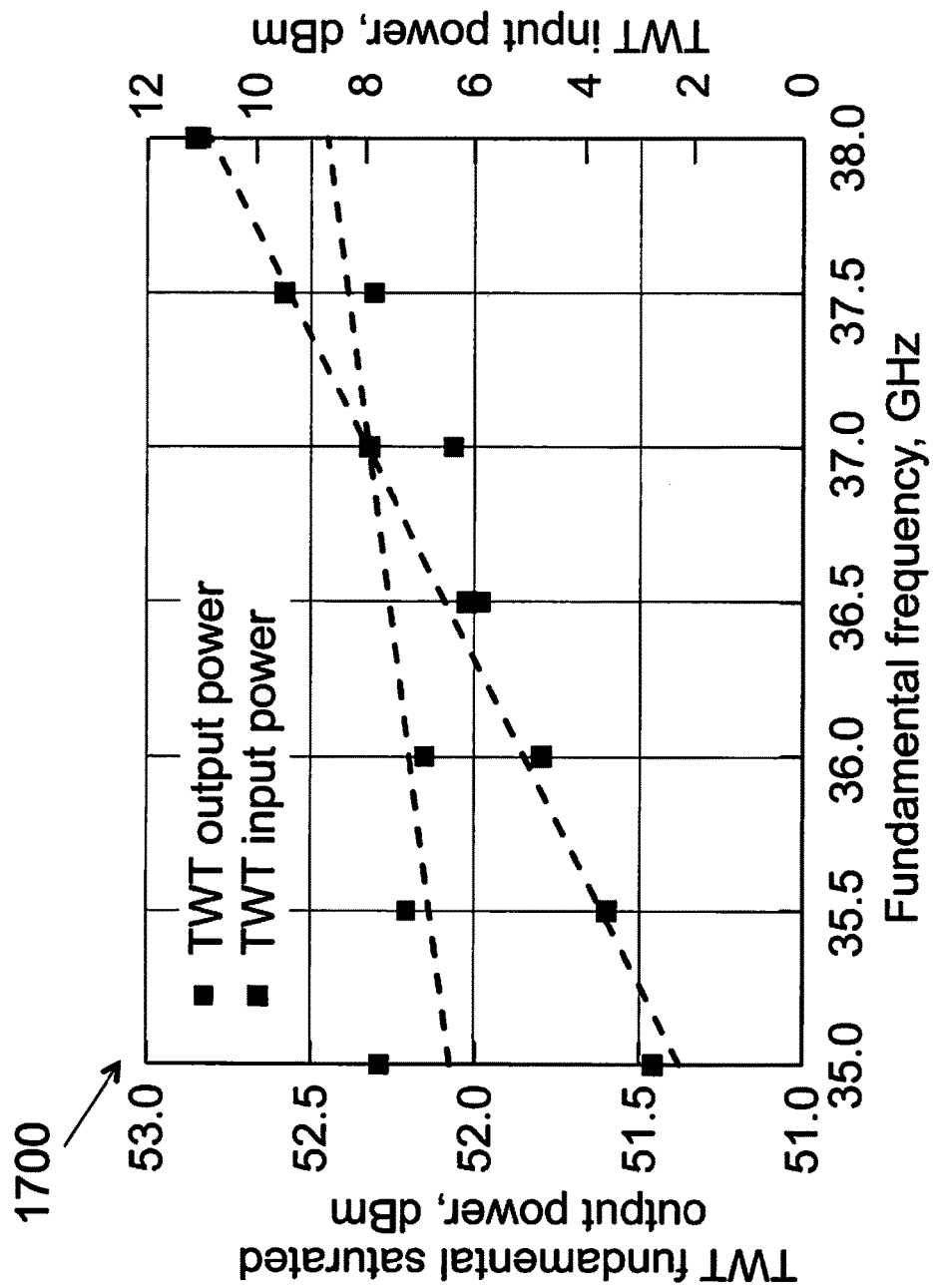
FIG. 17 is a graph illustrating the measured radio frequency power at Port 2 of the higher millimeter-wave multimode directional coupler at Ka-band fundamental frequencies, 35.0 to 38.0 GHz, according to an embodiment of the present invention.
Figure 18:
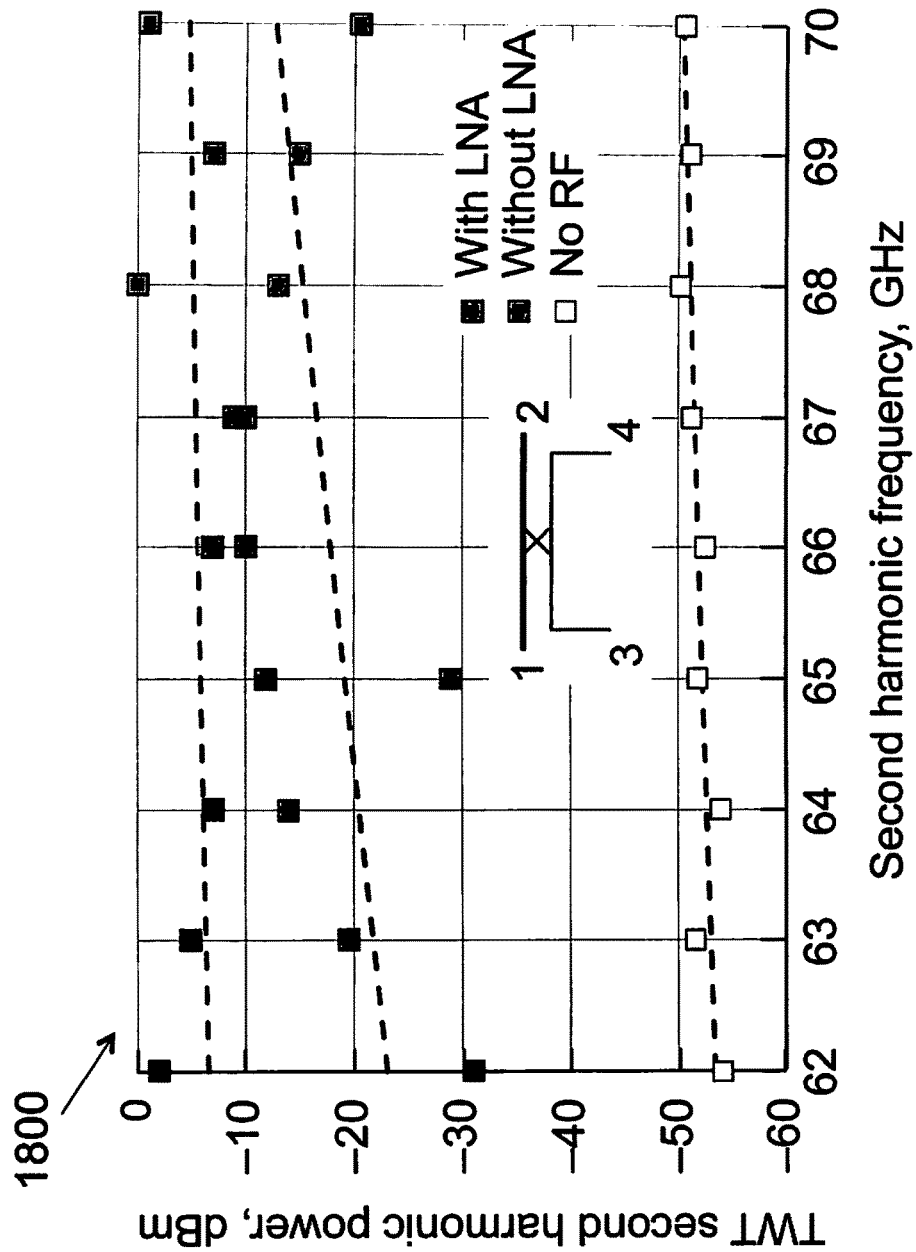
FIG. 18 is a graph illustrating the measured radio frequency power at Port 4 of the multimode directional coupler at E-band $2^{nd}$ harmonic frequencies, 62.0 to 70.0 GHz, according to an embodiment of the present invention.
Figure 19:
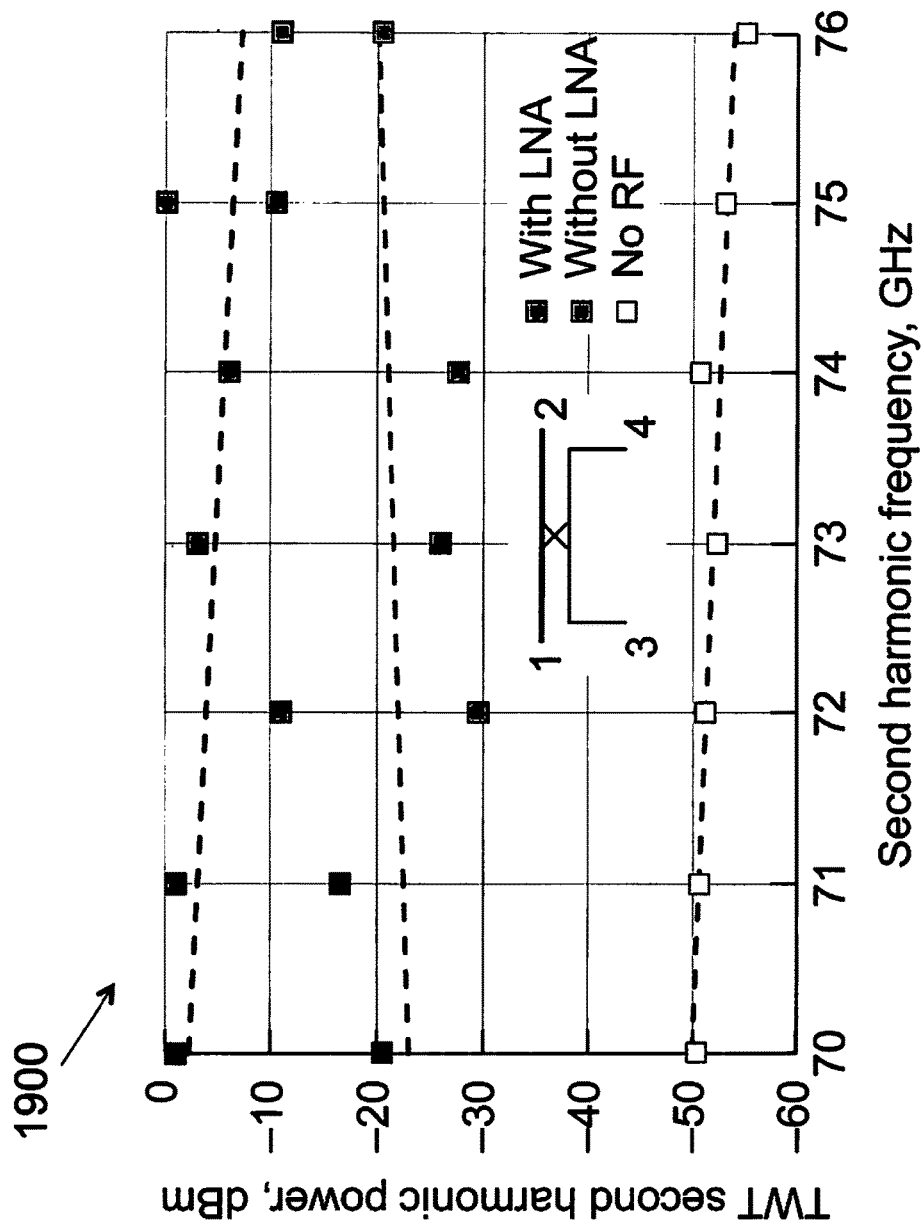
FIG. 19 is a graph illustrating the measured radio frequency power at Port 4 of the multimode directional coupler at E-band $2^{nd}$ harmonic frequencies, 70.0 to 76.0 GHz, according to an embodiment of the present invention.

Using the test circuit shown in FIG. 15, FIG. 16 shows a graph 1600 illustrating the measured radio frequency power at Port 2 of the multimode directional coupler at several Ka-band fundamental frequencies in the 31.0 to 35.0 GHz range. Similarly, FIG. 17 shows a graph 1700 illustrating the measured radio frequency power at Port 2 of the multimode directional coupler at several Ka-band fundamental frequencies in the 35.0 to 38.0 GHz range. FIG. 18 shows a graph 1800 illustrating the measured radio frequency power at Port 4 of the multimode directional coupler at the corresponding E-band $2^{nd}$ harmonic frequencies in the 62.0 to 70.0 GHz range. Similarly, FIG. 19 shows a graph 1900 illustrating the measured radio frequency power at Port 4 of the multimode directional coupler at the corresponding E-band $2^{nd}$ harmonic frequencies in the 70.0 to 76.0 GHz range. The measured data shows the presence of a strong $2^{nd}$ harmonic signal over a wide range of frequencies, which could be used as a satellite borne E-band beacon source for radio wave propagation studies.

Figure 20:
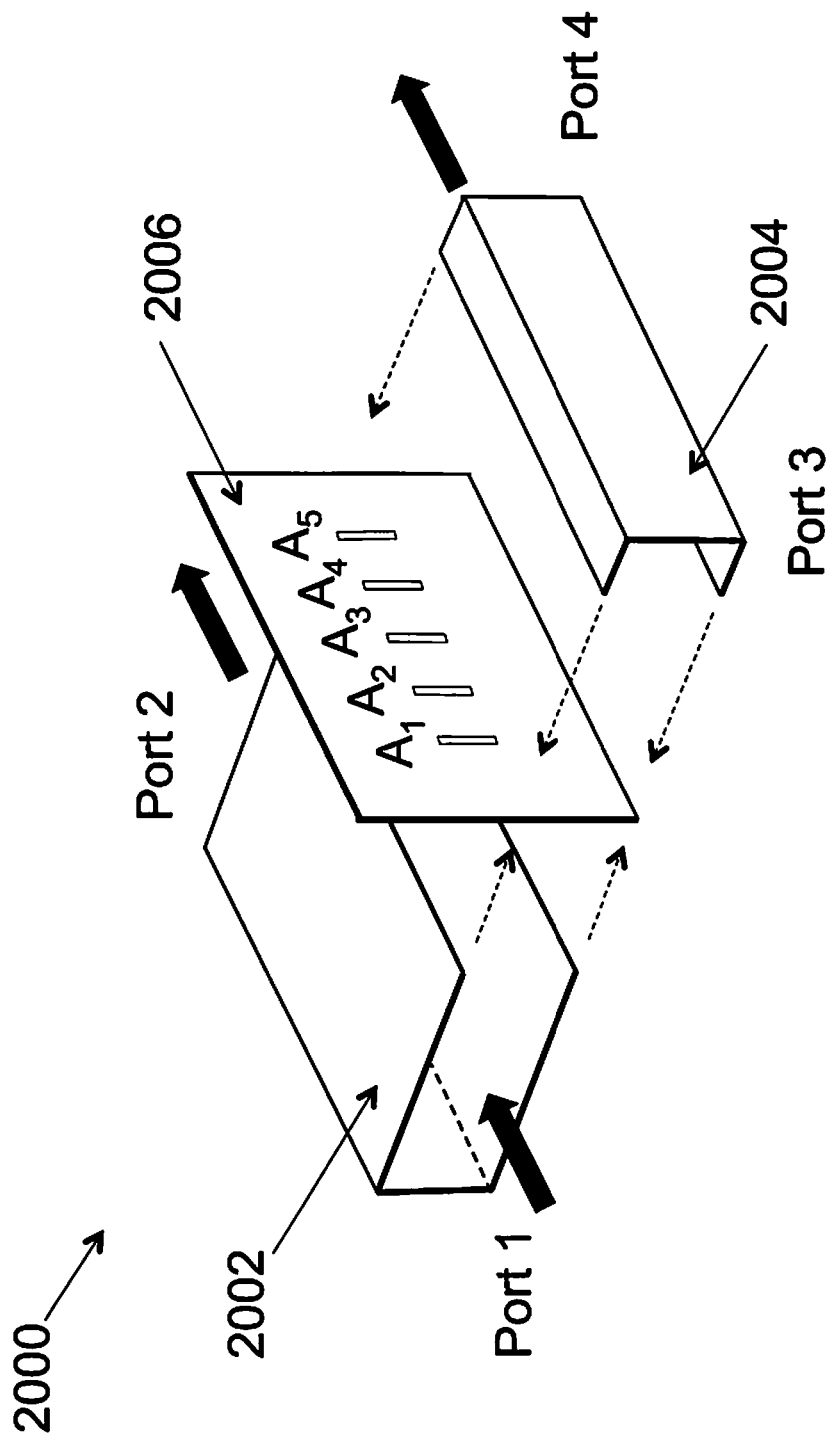
FIG. 20 is a schematic illustrating a multimode directional coupler having a construction where the two waveguide are constructed without the common wall and an insert, of potentially different metal and construction having multiple apertures, is inserted there between during construction.

FIG. 20 is a schematic 2000 illustrating an alternate embodiment of the present invention. In this embodiment, a primary waveguide 2002 having a first longitudinal axis and Ports 1 and 2 is operably connected to a secondary waveguide 2004 having a secondary longitudinal axis and Ports 3 and 4 without the common wall and an insert 2006, of potentially different metal and construction having multiple apertures, is inserted there between during construction. The secondary waveguide is rotated by 90 degrees about the second longitudinal axis.

Figure 21:
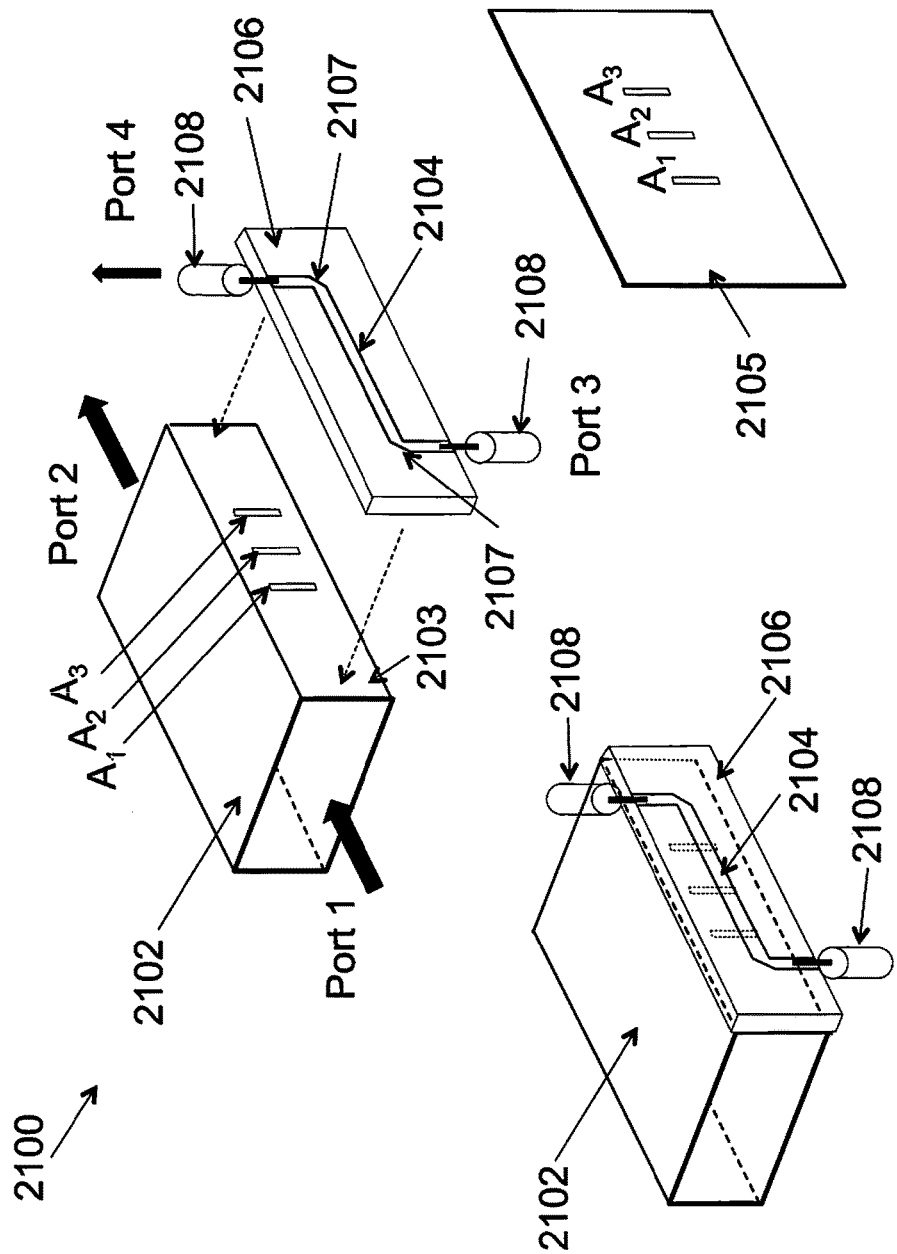
FIG. 21 is a schematic illustrating a multimode directional coupler having a construction where the secondary waveguide could be any one or combinations of the following microwave transmission lines on a thin dielectric substrate or printed circuit board: microstrip, slot line, coplanar waveguide (CPW), balanced stripline, suspended substrate stripline, etc, with coaxial connectors or transitions to rectangular or circular waveguide at either ends.

FIG. 21 is a schematic 2100 illustrating an alternate embodiment of the present invention. In this embodiment, a primary waveguide 2102 having a first longitudinal axis and Ports 1 and 2 is operably connected to a secondary microwave transmission line 2104 having a secondary longitudinal axis parallel to the first longitudinal axis and Ports 3 and 4 using either a common wall 2103 with apertures or an insert 2105 with apertures. The secondary transmission line 2104 could be any one or combinations of the following microwave transmission lines on a thin dielectric substrate 2106 or printed circuit board 2106: microstrip, slot line, coplanar waveguide (CPW), balanced stripline, suspended substrate stripline, etc. The dimensions, guide wavelength, and characteristic impedance of the secondary transmission line 2104 is determined using the thickness and relative permittivity of the dielectric substrate 2106. The secondary transmission line 2104 is located in close proximity above and orthogonal to the longitudinal axis of the apertures for strong coupling of the second or higher harmonic signals. The secondary transmission line 2104 could have bends 2107 at either end to facilitate the construction of the coupler. The secondary transmission line 2104 could have coaxial connectors 2108 or transitions to rectangular or circular waveguides at either end for outputting the second or higher harmonic signal.

Some embodiments of the present invention pertain to a multimode directional coupler configured to receive a primary signal and a secondary signal at a first port of a primary waveguide. The primary signal is configured to propagate through the primary waveguide and output at a second port of the primary waveguide. The multimode directional coupler also includes a secondary waveguide configured to couple the secondary signal from the primary waveguide with no coupling of the primary signal into the secondary waveguide. The secondary signal is configured to propagate through the secondary waveguide and output from a port of the secondary waveguide.

It will be readily understood that the components of the invention, as generally described and illustrated in the figures herein, may be arranged and designed in a wide variety of different configurations. Thus, the detailed description of the embodiments is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with an embodiment may be included in at least one embodiment of the invention. Thus, appearances of the phrases "in certain embodiments," "in some embodiments," "in other embodiments," or other similar language, throughout this specification do not necessarily all refer to the same embodiment or group of embodiments, and the described features, structures, or characteristics may be combined in any suitable manner in one or more embodiments.

One having ordinary skill in the art will readily understand that the invention as discussed above may be practiced with steps in a different order, and/or with hardware elements in configurations that are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
  a primary waveguide having first longitudinal axis and a first port at one end and a second port at the other end and configured to propagate a fundamental signal from the first port to the second port;
  a secondary waveguide having a first port at one end and a second port at the other end, the secondary waveguide configured to extract a second or higher harmonic signal from the primary waveguide, propagate the second or higher harmonic signal through the secondary waveguide, and exit the second or higher harmonic signal through the second port, a portion of said secondary waveguide having a longitudinal axis parallel to the first longitudinal axis; and
  a common wall shared by the primary and secondary waveguides such that the secondary waveguide is configured to extract the second or higher harmonic signal from the primary waveguide with minimum perturbation to the fundamental signal, wherein the common wall comprises a metal that is different from the metal of the primary or secondary waveguides or both.

2. The apparatus of claim 1, further comprising a plurality of apertures located in the common wall.

3. The apparatus of claim 2, wherein each of the plurality of apertures has a longitudinal axis that is perpendicular or substantially perpendicular to the first longitudinal axis of the primary waveguide and is configured to prevent the fundamental signal from coupling into the secondary waveguide.

4. The apparatus of claim 3, wherein at least one of the plurality of apertures comprises the shape of a rectangular aperture, a rectangular aperture with rounded edges, a circular aperture, or an arbitrary shaped aperture.

5. The apparatus of claim 4, wherein each of the plurality of apertures is configured to couple a portion of the second or higher harmonic signal from the primary waveguide into the secondary waveguide such that the second or higher harmonic signal is formed in the secondary waveguide.

6. The apparatus of claim 5, wherein the secondary waveguide further comprises an output port wherein the secondary waveguide propagates the second or higher harmonic signal and outputs the second or higher harmonic signal from the output port.

7. The apparatus of claim 1, wherein the primary waveguide and the secondary waveguide comprise a plurality of walls.

8. The apparatus of claim 7, wherein the thickness of the common wall is less than the thickness of each of the plurality of walls in the primary and secondary waveguides.

9. The apparatus of claim 1, wherein the primary waveguide is configured to receive the fundamental signal and the second or higher harmonic signal at the first port.

10. The apparatus of claim 1, wherein the secondary waveguide is rotated 90 degrees about the second longitudinal axis and configured to extract the second or higher harmonic signal from the primary waveguide such that the fundamental signal is prevented from coupling into the secondary waveguide.

11. The apparatus of claim 10, wherein the primary signal comprises a dominant mode frequency of a signal source.

12. The apparatus of claim 11, wherein the secondary signal comprises at least one higher order mode frequency of a signal source.

13. The apparatus of claim 1, wherein each of the plurality of apertures located in the common wall has a height and a width.

14. The apparatus of claim 13, wherein the width of each of the plurality of apertures located in the common wall is smaller than the wavelength of the fundamental or higher harmonic signal.

15. The apparatus of claim 14, wherein the height of each of the plurality of apertures located in the common wall varies relative to its adjacent aperture.

16. The apparatus of claim 15, further comprising a gap between each of the plurality of apertures located in the common wall.

17. The apparatus of claim 16, wherein each gap between each of the plurality of apertures located in the common wall is substantially equal to the other gaps.

18. The apparatus of claim 1, wherein the common wall is fabricated from a thin metal foil.

19. The apparatus of claim 18, further comprising a plurality of apertures located in the common wall.

* * * * *